United States Patent
Edwards

(10) Patent No.: US 11,387,333 B2
(45) Date of Patent: Jul. 12, 2022

(54) LOCOS WITH SIDEWALL SPACER FOR TRANSISTORS AND OTHER DEVICES

(71) Applicant: Texas Instruments Incorporated, Dallas, TX (US)

(72) Inventor: Henry Litzmann Edwards, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/704,833

(22) Filed: Dec. 5, 2019

(65) Prior Publication Data
US 2020/0119149 A1 Apr. 16, 2020

Related U.S. Application Data

(62) Division of application No. 16/156,769, filed on Oct. 10, 2018, now Pat. No. 10,529,812.

(51) Int. Cl.
*H01L 29/40* (2006.01)
*H01L 27/088* (2006.01)
(Continued)

(52) U.S. Cl.
CPC ...... *H01L 29/408* (2013.01); *H01L 21/02238* (2013.01); *H01L 21/02304* (2013.01);
(Continued)

(58) Field of Classification Search
CPC ............ H01L 29/408; H01L 29/66681; H01L 29/66659; H01L 29/6625; H01L 29/66568; H01L 29/7816; H01L 29/7823; H01L 29/7833; H01L 29/7834; H01L 29/7835; H01L 29/7836; H01L 29/78618; H01L 29/78621; H01L 29/7824; H01L 27/088; H01L 27/0883; H01L 21/02107; H01L 21/76202; H01L 29/42364; H01L 29/42368; H01L 23/5286; H01L 29/7817; H01L 27/0922; H01L 29/861; H01L 21/02225–0223; H01L 21/0227; H01L 21/02321; H01L 21/02323; H01L 21/762; H01L 21/76205–76221; H01L 2027/11833

See application file for complete search history.

(56) References Cited

U.S. PATENT DOCUMENTS 5,895,257 A 4/1999 Tsai et al.
6,268,268 B1 7/2001 Tokushige
(Continued)

*Primary Examiner* — Sonya McCall-Shepard
(74) *Attorney, Agent, or Firm* — Jacqueline J. Garner; Charles A. Brill; Frank D. Cimino

(57) ABSTRACT

An integrated circuit (IC) includes a first field-plated field effect transistor (FET), and a second field-plated FET, and functional circuitry configured together with the field-plated FETs for realizing at least one circuit function in a semiconductor surface layer on a substrate. The field-plated FETs include a gate structure including a gate electrode partially over a LOCOS field relief oxide and partially over a gate dielectric layer. The LOCOS field relief oxide thickness for the first field-plated FET is thicker than the LOCOS field relief oxide thickness for the second field-plated FET. There are sources and drains on respective sides of the gate structures in the semiconductor surface layer.

19 Claims, 9 Drawing Sheets

(51) Int. Cl.
*H01L 23/528* (2006.01)
*H01L 29/78* (2006.01)
*H01L 29/423* (2006.01)
*H01L 21/8234* (2006.01)
*H01L 21/02* (2006.01)
*H01L 29/66* (2006.01)
*H01L 21/762* (2006.01)
*H01L 29/861* (2006.01)

(52) U.S. Cl.
CPC ........ *H01L 21/823462* (2013.01); *H01L 21/823475* (2013.01); *H01L 23/5286* (2013.01); *H01L 27/088* (2013.01); *H01L 29/401* (2013.01); *H01L 29/42368* (2013.01); *H01L 29/66681* (2013.01); *H01L 29/7816* (2013.01)

(56) References Cited

U.S. PATENT DOCUMENTS

| | | | |
|---|---|---|---|
| 8,871,594 B2 * | 10/2014 | Mariani | H01L 29/7816 438/279 |
| 9,583,612 B1 | 2/2017 | Edwards et al. | |
| 9,887,288 B2 | 2/2018 | Edwards et al. | |
| 2004/0262685 A1 * | 12/2004 | Zingg | H01L 29/7824 257/347 |
| 2006/0068552 A1 * | 3/2006 | Ogura | H01L 29/66681 438/279 |
| 2008/0318393 A1 * | 12/2008 | Akao | H01L 23/585 438/453 |
| 2015/0137232 A1 * | 5/2015 | Huang | H01L 21/76202 257/343 |
| 2015/0295069 A1 * | 10/2015 | Xu | H01L 21/02238 438/286 |
| 2016/0027773 A1 * | 1/2016 | Chen | H01L 27/0251 257/337 |
| 2016/0181351 A1 * | 6/2016 | Kim | H01L 27/0629 438/382 |

* cited by examiner

LOCOS WITH SIDEWALL SPACER FOR TRANSISTORS AND OTHER DEVICES

CROSS REFERENCE TO RELATED APPLICATIONS

This application is a divisional of U.S. Nonprovisional patent application Ser. No. 16/156,769, filed Oct. 10, 2018, the contents of which is herein incorporated by reference in its entirety.

FIELD

This Disclosure relates to integrated circuits having field-plated field effect transistors and other field-plated devices.

BACKGROUND

Some integrated circuits (ICs) contain field effect transistors (FETs) that have drift regions with a field relief oxide layer thereon that enables higher voltage operation. The drift regions deplete under high drain voltage conditions, allowing the FET to block the voltage applied between the drain and source while supporting conduction during the ON-state of the device. A higher voltage FET tends to be formed with the gate electrode extending over field oxide in order to act as a field plate for the drift region.

LOCal Oxidation of Silicon (LOCOS) is a semiconductor fabrication oxidation process that uses a patterned oxygen diffusion barrier layer, commonly a silicon nitride layer, over areas not meant to be oxidized, where a thermally grown silicon dioxide layer is formed within aperture regions of the oxygen diffusion barrier layer at a given thickness, with a thinner tapered silicon oxide region being formed along the edges of the oxygen diffusion barrier layer. Although the active areas widths bordered by LOCOS oxide can be varied, LOCOS provides a single given oxide thickness across the die and across the wafer.

SUMMARY

This Summary is provided to introduce a brief selection of disclosed concepts in a simplified form that are further described below in the Detailed Description including the drawings provided. This Summary is not intended to limit the claimed subject matter's scope.

Disclosed aspects include an IC with a semiconductor surface layer on a substrate including a first field-plated FET, a second field-plated FET, and functional circuitry configured together with the field-plated FETs for realizing at least one circuit function. The field-plated FETs include a gate structure including a gate electrode partially over a LOCOS field relief oxide and partially over a gate dielectric layer. The LOCOS field relief oxide thickness for the first field-plated FET is thicker than the LOCOS field relief oxide thickness for the second field-plated FET. There are sources and drains on respective sides of the gate structures in the semiconductor surface layer.

BRIEF DESCRIPTION OF THE DRAWINGS

Reference will now be made to the accompanying drawings, which are not necessarily drawn to scale, wherein.

DETAILED DESCRIPTION

Figure 1A:
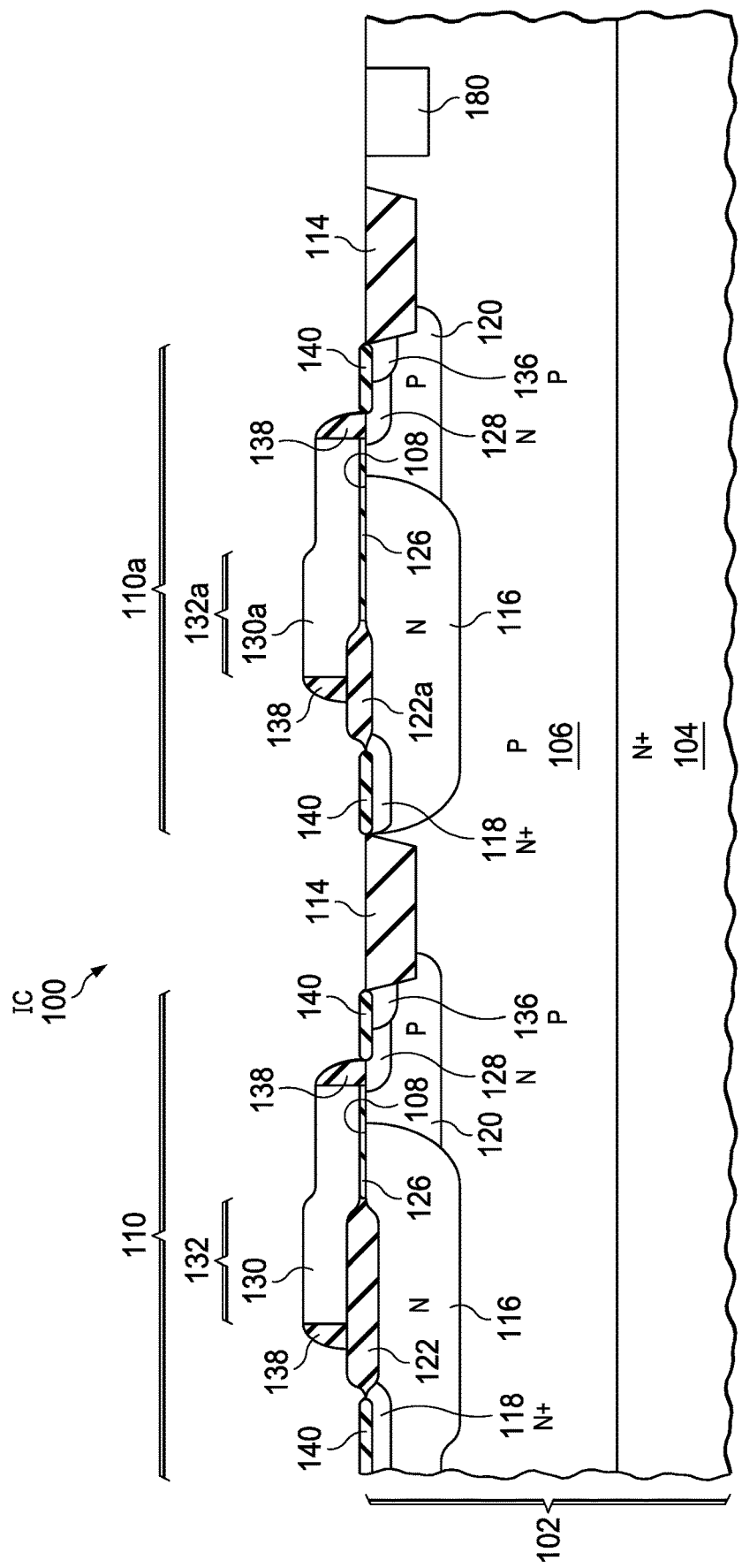
FIG. 1A is a cross sectional depiction of an example IC including a first and a second field-plated FET that have different LOCOS field relief oxide thicknesses, shown by example as being laterally diffused metal oxide semiconductor (LDMOS) devices, according to an example aspect.

Example aspects are described with reference to the drawings, wherein like reference numerals are used to designate similar or equivalent elements. Illustrated ordering of acts or events should not be considered as limiting, as some acts or events may occur in different order and/or concurrently with other acts or events. Furthermore, some illustrated acts or events may not be required to implement a methodology in accordance with this disclosure.

Also, the terms "coupled to" or "couples with" (and the like) as used herein without further qualification are intended to describe either an indirect or direct electrical connection. Thus, if a first device "couples" to a second device, that connection can be through a direct electrical connection where there are only parasitics in the pathway, or through an indirect electrical connection via intervening items including other devices and connections. For indirect coupling, the intervening item generally does not modify the information of a signal but may adjust its current level, voltage level, and/or power level.

Disclosed aspects recognize for field-plated FETs that have a field relief oxide to electronically isolate a field plate from the drift region, the thickness of this field relief oxide is important to the performance of the FET, such as its voltage rating. The field plate can comprise polysilicon or a metal comprising material. The field-plated FET can also be configured as a power diode. An example of a field-plated power FET is a diffused (or drain extended) metal oxide semiconductor (DMOS) device, such as an LDMOS device, where the field-plated power FET can be an n-channel device or a p-channel device.

If the field relief oxide is too thin the field-plated FET's breakdown voltage (from D to G and S) will suffer, whereas if the field relief oxide is too thick the field plate will be ineffective at shaping the electric field lines in off-state, and the ON-resistance of the device will increase due to reduced carrier accumulation in ON-state. The field relief oxide thickness needed is thus recognized to vary depending upon the off-state drain voltage rating of the FET. For field-plated FETs integrated into a Bipolar Complementary Metal Oxide Semiconductor (BiCMOS) process, this presents a cost and/or complexity problem, because multiple voltage rating power transistors need to co-exist in the same technology, including in some cases on the same IC product.

It is also recognized that known LOCOS approaches for forming field relief oxide have the disadvantage of only providing a single given oxide thickness, thus limiting the ability to support field-plated FETs that operate two or more drain voltages. This Disclosure describes a LOCOS process flow that utilizes sidewall spacers to produce two or more distinct LOCOS field relief oxide thicknesses, making disclosed LOCOS processing capable of providing good FET performance across a wider voltage range as compared to known LOCOS processes for forming a field relief oxide.

The sidewall spacers in different width oxygen diffusion barrier (ODB) layer openings to the silicon surface enable creating at least two different silicon oxide thicknesses from a single mask level and patterning step. The sidewall spacers (e.g., comprising silicon nitride) inside an ODB layer opening creates two (or more) different LOCOS oxide layer thicknesses, which depend on the width of the ODB layer opening. The width of the wider ODB layer opening is generally at least 0.05 µm wider than the width of the narrower ODB layer opening. For example, the ODB layer opening width can be 0.2 µm for a 9V rated LDMOS device, and can be 0.3 µm wide for an 11V rated LDMOS device.

FIG. 1A is a cross sectional depiction of an example IC 100 including a higher voltage rated n-channel field-plated FET 110 and a lower voltage rated n-channel field-plated FET 110a, shown by example as both being LDMOS devices, according to an example aspect. The IC 100 also includes functional circuitry 180 shown as a block that comprises circuit elements (including transistors, and generally diodes, resistors, capacitors, etc.) formed in the semiconductor surface layer shown as a p-type layer 106 that is configured together with the field-plated FETs 110, 110a for realizing at least one circuit function such as analog (e.g., an amplifier, power converter or power FET, radio frequency (RF), digital, or a memory function.

Although a pair of n-channel field-plated FETs is described, an analogous p-channel field-plated FET is readily understood from the Disclosure with appropriate changes to the polarities of dopants. The IC 100 includes a substrate 102, with an optional heavily doped n-type (shown as n+) buried layer 104 and a p-type layer 106 over the n-type buried layer 104. The p-type layer 106 extends to a top surface 108 of the substrate 102. Although the IC 100 is shown including n-channel field-plated FET 110 and n-channel field-plated FET 110a, the IC 100 may also optionally include conventional planar FETs, such as within the functional circuitry 180. Components of the IC 100, such as the field-plated FET 110 and the field-plated FET 110a may be laterally separated by the field oxide 114 shown. The field oxide 114 may comprise a shallow trench isolation (STI) structure as depicted in FIG. 1A, or may also have a LOCOS oxide structure.

The field-plated FETs 110, 110a include an n-type drift region 116 disposed in the p-type layer 106. The drift region 116 extends from an n-type drain contact region 118 to a p-type body 120 of the field-plated FETs 110, 110a. An average dopant density of the drift region 116 may be, for example, $5 \times 10^{15}$ cm$^{-3}$ to $5 \times 10^{16}$ cm$^{-3}$. The drift region 116 may have a heavier-doped top portion and a lighter doped bottom portion, to provide desired values of breakdown voltage and specific resistance for the field-plated FETs 110, 110a. A layer of thicker LOCOS field relief oxide 122 shown having a LOCOS oxide bird's beak edge shape is disposed over the drift region 116 for the field-plated FET 110 and a layer of thinner LOCOS field relief oxide 122a as compared to the LOCOS field relief oxide 122 having a LOCOS oxide bird's beak edge shape is disposed over the drift region 116 for the field-plated FET 110a. Being LOCOS derived, the LOCOS field relief oxides 122, 122a have a tapered profile at their lateral edges, commonly referred to as a bird's beak. The LOCOS field relief oxides 122, 122a are generally thinner than the field oxide 114. The drift regions 116 extend past the LOCOS field relief oxides 122, 122a by a lateral distance adjacent to the p-type body 120.

A gate dielectric layer 126 of the field-plated FET 110, 110a is disposed on the top surface 108 of the substrate 102, extending from the LOCOS field relief oxide 122, 122a to an n-type source 128 of the field-plated FETs 110, 110a abutting the body 120 opposite from the drift region 116. The gate dielectric layer 126 is disposed over a portion of the drift region 116 which extends past the LOCOS field relief oxides 122, 122a, and over a portion of the body 120 between the drift region 116 and the source 128. The LOCOS field relief oxide 122, 122a thickness are both generally at least twice as thick as the gate dielectric layer 126.

The field-plated FETs 110, 110a each include a gate electrode 130, 130a disposed over the gate dielectric layer 126, extending from the source 128, over the portion of the body 120 between the drift region 116 and the source 128, and over the portion of the drift region 116 which extends past the LOCOS field relief oxide 122. In the instant example, the gate electrodes 130, 130a extends partway over the LOCOS field relief oxide 122, 122a, to provide a field plate 132, 132a over a portion of the drift region 116. In an alternate version of the instant example, the field plate may be provided by a separate structural element from the gate electrodes 130, 130a. The thicknesses of the respective LOCOS field relief oxide 122, 122a may be separately selected to provide a desired maximum value of electric field in the drift region 116 during operation of the field-plated FETs 110, 110a.

The field-plated FETs 110, 110a may also include a p-type body contact region 136 disposed in the substrate 102 in the body 120. Gate sidewall spacers 138 may be disposed on side surfaces of the gate 130. A metal silicide 140 may be disposed on the drain contact region 118, the source 128, and the body contact region 136. The field-plated FETs 110, 110a may have a drain-centered configuration in which the drain contact region 118 that is surrounded by the LOCOS field relief oxide 122, 122a which is surrounded by the body 120 and the source 128. Other configurations of the field-plated FET 110, 110a are within the scope of the instant example.

Figure 1B:
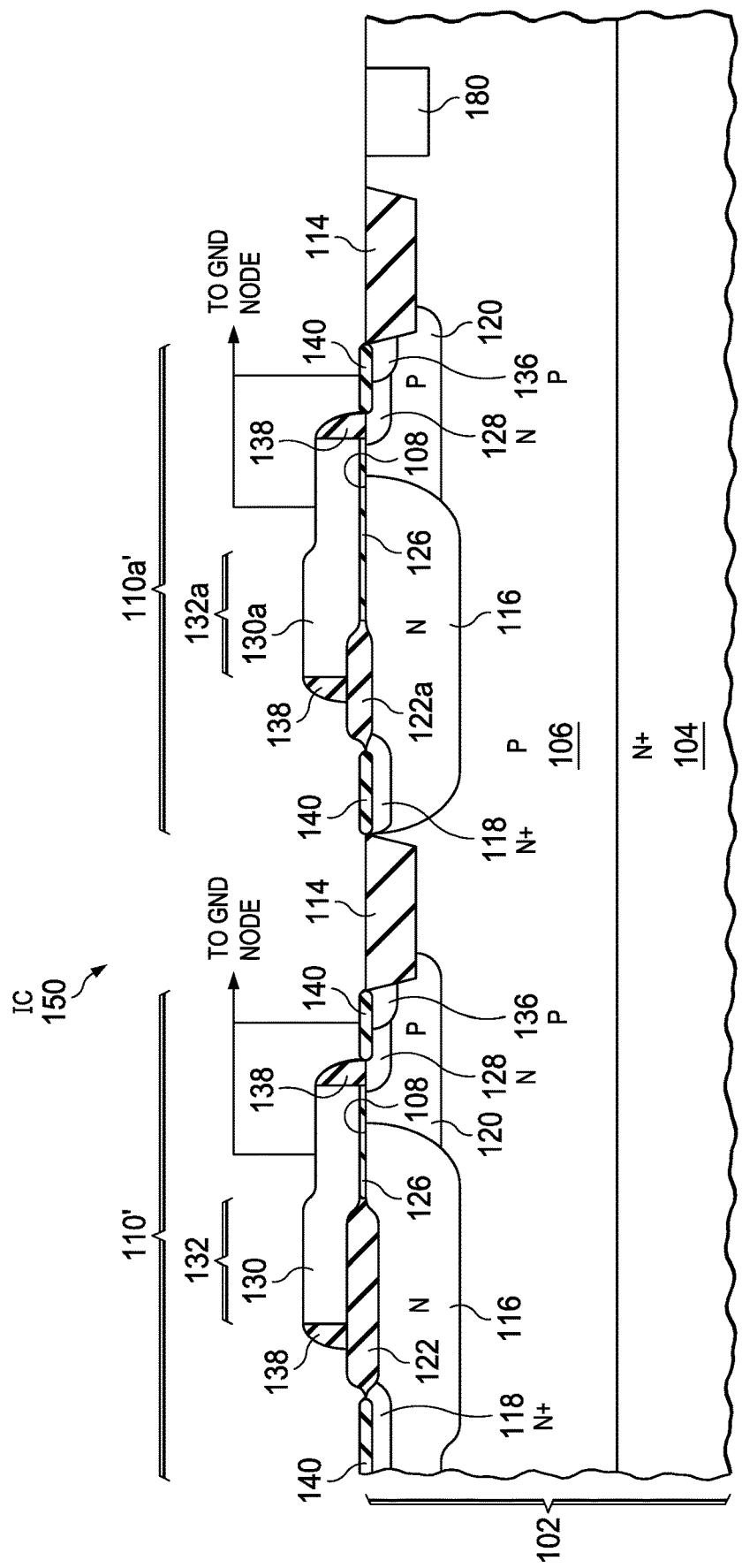
FIG. 1B is a cross sectional depiction of an example IC including a first and a second power diode both made from the LDMOS devices shown in FIG. 1A that have different LOCOS field relief oxide thicknesses, according to an example aspect.

FIG. 1B is a cross sectional depiction of an example IC 150 including a first power diode 110' and a second power diode 110a' both made from the LDMOS devices referred to as field-plated FETs 110, 110a in FIG. 1A that have different LOCOS field relief oxide thicknesses, according to an example aspect. As known in power electronics, a power diode can be made from a power MOS device such as an LDMOS device by grounding the gate, such as using a metal 1 connection, and optionally also grounding the source, to a ground node on the IC, with the gates 130, 130a and sources 128 shown in FIG. 1B as being connected to a "GND node" that is on the IC 150. Being power diodes there is also the option to also remove the sources 128, although the sources 128 are shown in FIG. 1B. The diode junction utilized by power diodes 110' and 110a' is between the drift region 116 which for an NLDMOS device is the n-type side that is contacted by the drain contact 118 and the p-type layer 106 generally through a p+ contact (not shown).

Figure 2A:
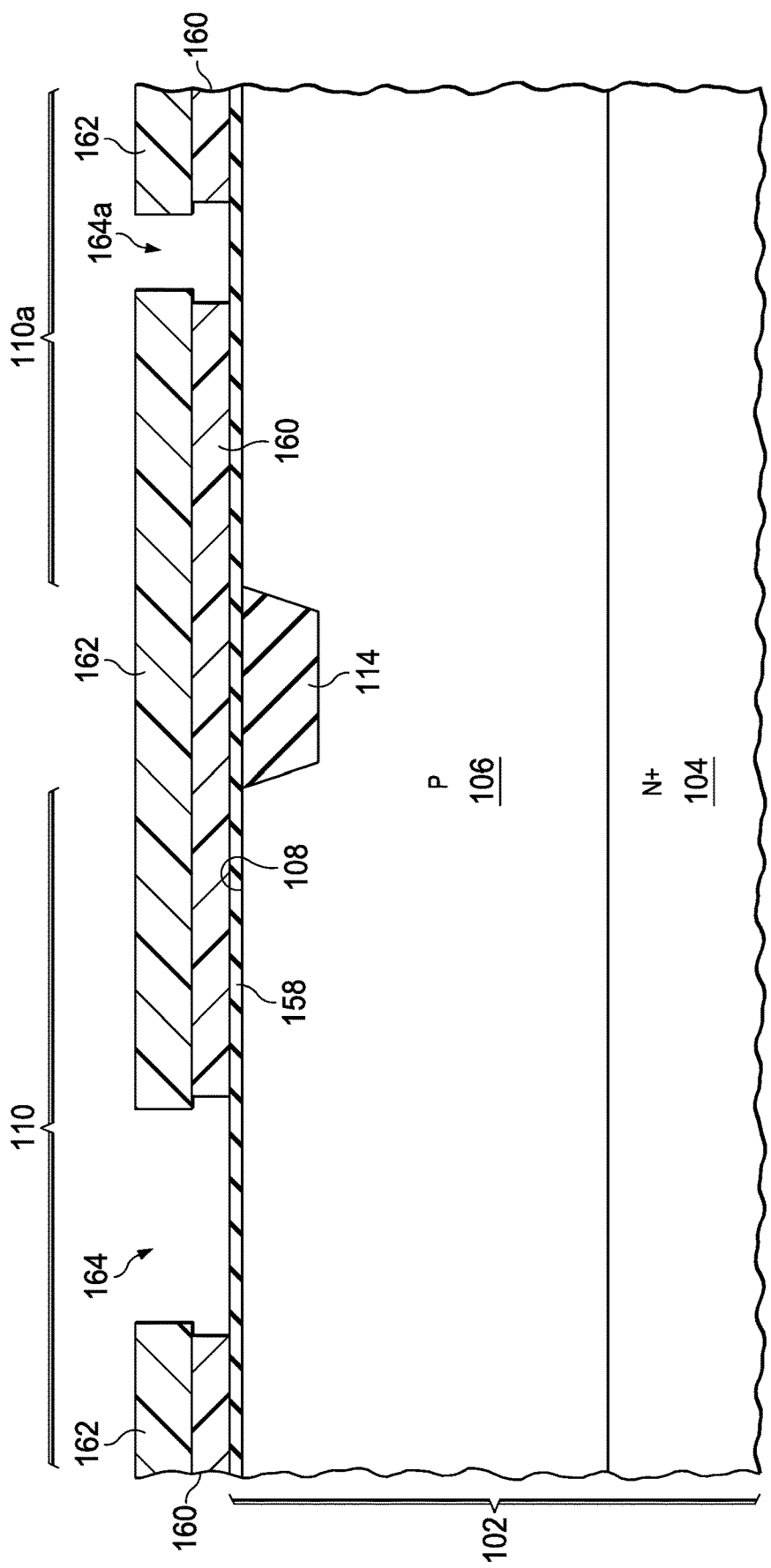
FIGS. 2A-2G are cross-sectional diagrams showing processing progression for an example method of forming an IC including a first and a second field-plated FET that have different LOCOS field relief oxide thicknesses, shown again by example as being LDMOS devices, according to an example aspect.

FIG. 2A through FIG. 2G are successive cross sections of the field-plated FETs 110, 110a of the IC 100 shown in FIG. 1A, depicting successive stages of an example method of formation. Referring to FIG. 2A, the substrate 102 may be formed by starting with a p-type silicon wafer, possibly with at least one epitaxial layer thereon, and forming the n-type buried layer 104 by ion implanting n-type dopants such as antimony or arsenic at a dose of $1 \times 10^{15}$ cm$^{-2}$ to $1 \times 10^{16}$ cm$^{-2}$. A thermal drive process heats the wafer to activate and diffuse the implanted n-type dopants. The p-type layer 106 may be formed on the wafer by an epitaxial process with in-situ p-type doping. The epitaxially formed material may be, for example 4 microns to 6 microns thick. The n-type dopants diffuse partway into the epitaxially grown material, so that the n-type buried layer 104 overlaps a boundary between the original silicon wafer and the epitaxially grown material. An average bulk resistivity of the p-type layer 106 may be, for example, 1 ohm-cm to 10 ohm-cm. An optional p-type buried layer may be formed in the p-type layer 106 by implanting boron at an energy, for example, of 2 megaelectron volts (MeV) to 3 MeV.

The field oxide 114 is formed at the top surface 108 of the substrate 102, for example by an STI process or a LOCOS process. An example STI process includes forming a chemical mechanical polish (CMP) stop layer of silicon nitride and a layer of STI pad oxide over the substrate 102. Isolation trenches are etched through the CMP stop layer and the STI pad oxide and into the substrate 102. The isolation trenches are filled with silicon dioxide using a plasma enhanced chemical vapor deposition (PECVD) process using tetraethyl orthosilicate (TEOS), a high density plasma (HDP) process, a high aspect ratio process (HARP) using TEOS and ozone, an atmospheric chemical vapor deposition (APCVD) process using silane, or a sub-atmospheric chemical vapor deposition (SACVD) process using dichlorosilane ($SiH_2Cl_2$). Excess silicon dioxide is generally removed from over the CMP stop layer by an oxide CMP process. The CMP stop layer is subsequently removed, leaving the field oxide 114. An example LOCOS process includes forming a silicon nitride mask layer over a layer of LOCOS pad oxide over the substrate 102. The silicon nitride mask layer is removed in areas for the field oxide 114, exposing the LOCOS pad oxide. Silicon dioxide is formed in the areas exposed by the silicon nitride mask layer by thermal oxidation, to form the field oxide 114. The silicon nitride mask layer is subsequently removed, leaving the field oxide 114 in place.

A layer of pad oxide 158 is formed at the top surface 108 of the substrate 102. The pad oxide 158 may be, for example, 20 to 250 A thick, 100 A thick being typical, and may be formed by thermal oxidation or by any of several chemical vapor deposition (CVD) processes. A first ODB layer 160 is formed over the layer of pad oxide 158. The first ODB layer 160 may include, for example, silicon nitride, formed by a low pressure chemical vapor deposition (LPCVD) process using dichlorosilane and ammonia. Alternatively, silicon nitride for the first ODB layer 160 may be formed by decomposition of bis(tertiary-butyl-amino) silane (BTBAS). Other processes to form the first ODB layer 160 are possible.

An etch mask 162 is formed over the first ODB layer 160 which exposes an area of the top surface 108 of the substrate 102 for growing the LOCOS field relief oxide 122, 122a of FIG. 1A in the area for the field-plated FETs 110, 110a. The etch mask 162 may include photoresist formed by a photolithography process, and may also include hard mask material such as amorphous carbon, and may include an antireflection layer such as an organic bottom anti-reflection coat (BARC). The exposed area of the top surface 108 of the substrate 102 for the LOCOS field relief oxide 122 for the field-plated FETs 110 has lateral dimensions that are sufficiently wide so that after etching the first ODB layer 160, a central portion of the etched area remains clear after formation of dielectric sidewalls.

The first ODB layer 160 is removed in the areas exposed by the etch mask 162, exposing the layer of pad oxide 158. A portion of the pad oxide 158 may also be removed in the areas exposed by the etch mask 162. Removing the first ODB layer 160 in the area for the field-plated FETs 110, 110a forms different width openings in the first ODB layer 160 comprising a $1^{st}$ first ODB layer opening 164 for field-plated FET 110 shown relatively wider and a $2^{nd}$ first ODB layer opening 164a for field-plated FET 110a shown relatively narrower in width.

The first ODB layer 160 may be removed by a wet etch, for example an aqueous solution of phosphoric acid, which undercuts the etch mask 162 as depicted in FIG. 2A. Alternatively, the first ODB layer 160 may be removed by a plasma etch using fluorine radicals, which may produce less undercut. The etch mask 162 may optionally be removed after etching the first ODB layer 160, or may be left in place to provide additional stopping material in a subsequent ion implant step. At this point there is an option for a silicon etch by etching the pad oxide 158 to expose the top surface 108 in the first ODB layer openings 164, 164a and performing a silicon etch in the openings before the first LOCOS process described below to enable deeper current flow for the field-plated FETs 110, 110a.

Figure 2B:
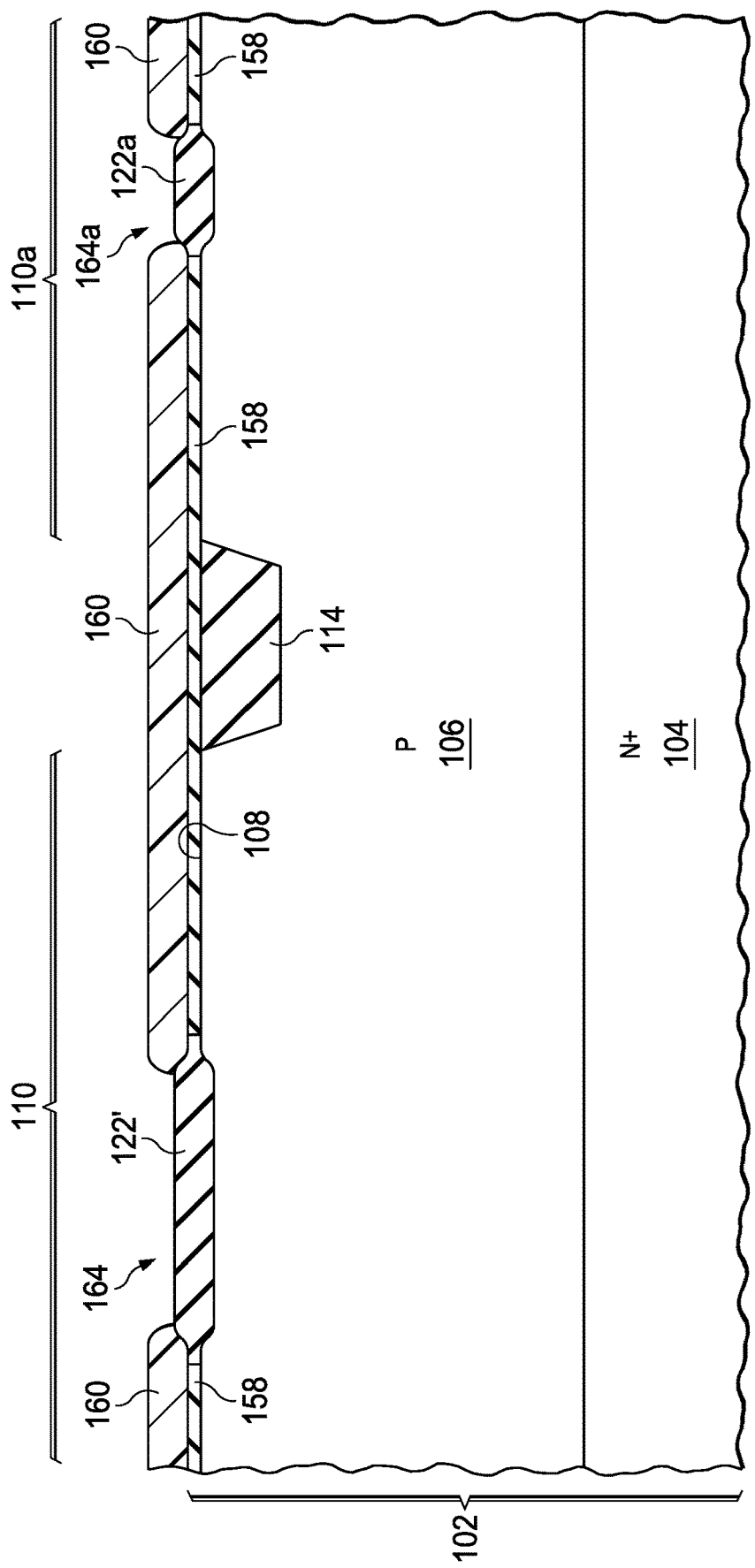

Referring now to FIG. 2B, this FIG. shows the results after growing a first LOCOS layer 122', 122a with a typical thickness of 200 to 1,000 A, so that a first portion of the LOCOS field relief oxide 122', 122a providing the first LOCOS layer is formed by thermal oxidation in the $1^{st}$ first ODB layer opening 164 in the area for the field-plated FET 110 and in $2^{nd}$ first ODB layer opening 164a in the area for the field-plated FET 110a, both growing essentially the same the LOCOS field relief oxide thickness. The LOCOS field relief oxides 122', 122a providing first LOCOS layer has the characteristic LOCOS oxidation bird's beaks shown.

An example furnace thermal oxidation process for growing a first LOCOS oxide layer may include ramping a temperature of the furnace to about 1000° C. in a time period of 45 minutes to 90 minutes with an ambient of 2 percent to 10 percent oxygen, maintaining the temperature of the furnace at about 1000° C. for a time period of 10 minutes to 20 minutes while increasing the oxygen in the ambient to 80 percent to 95 percent oxygen, maintaining the temperature of the furnace at about 1000° C. for a time period of 60 minutes to 120 minutes while maintaining the oxygen in the ambient at 80 percent to 95 percent oxygen and adding hydrogen chloride gas to the ambient, maintaining the temperature of the furnace at about 1000° C. for a time period of 30 minutes to 90 minutes while maintaining the oxygen in the ambient at 80 percent to 95 percent oxygen with no hydrogen chloride, and ramping the temperature of the furnace down in a nitrogen ambient.

There can be an optional self-aligned (un-masked) ion implant before the depositions described below, to place boron below what will later be formed a drift region (see drift region 116 in FIG. 1A described above). For an NMOS device, this ion implantation can comprise boron at 200 keV to 2 MeV at a dose level of $5 \times 10^{11}$ cm$^{-2}$ to $5 \times 10^{12}$ cm$^{-2}$.

Figure 2C:
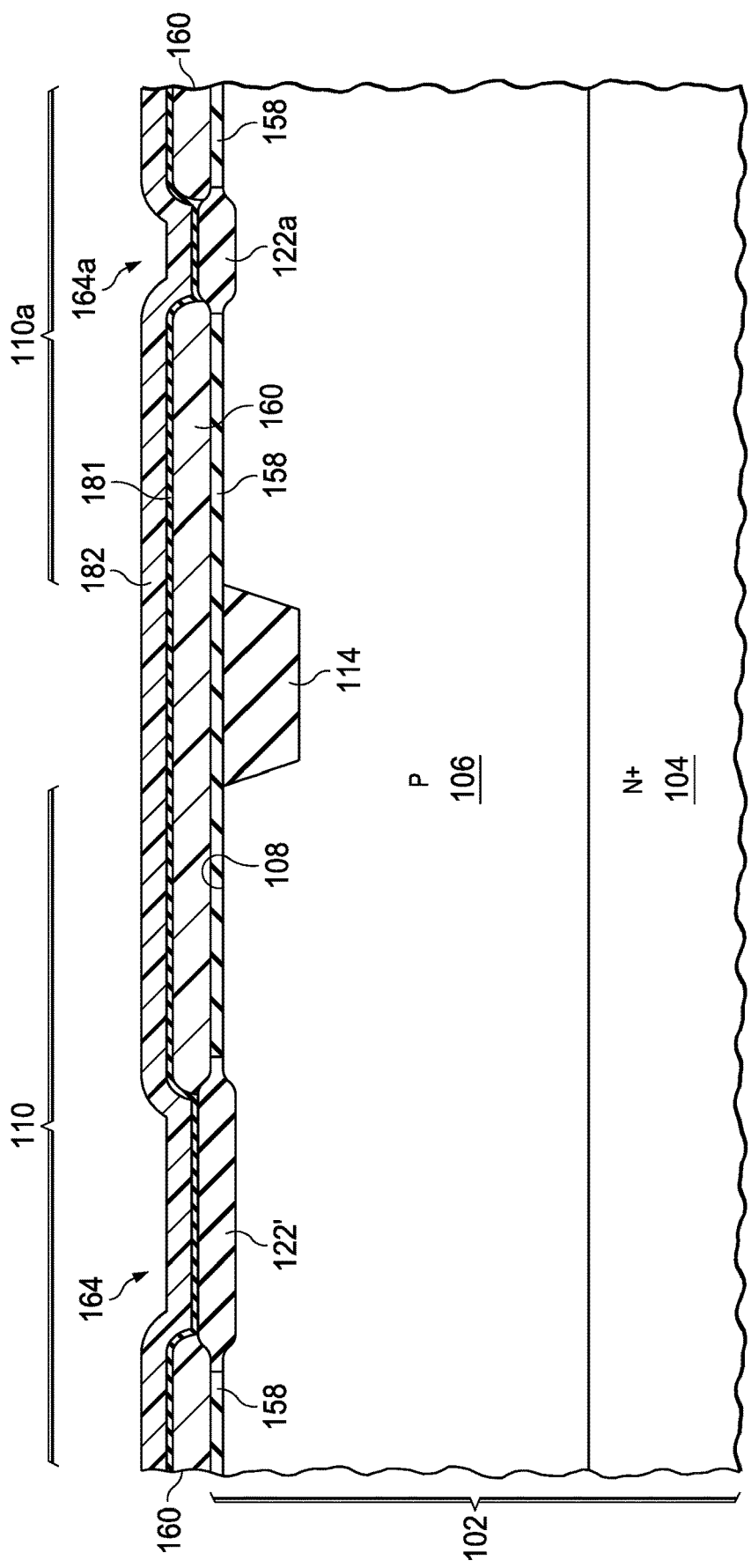

FIG. 2C shows results after depositing a second ODB layer 181 and then depositing a sacrificial sidewall film 182 thereon that functions as a sacrificial sidewall layer. The second ODB layer 181 can comprise silicon nitride (SiN) that is 100 to 500 A thick. The sacrificial sidewall film 182 can comprise polysilicon or a dielectric material, such as being 400 to 1,500 A thick.

Figure 2D:
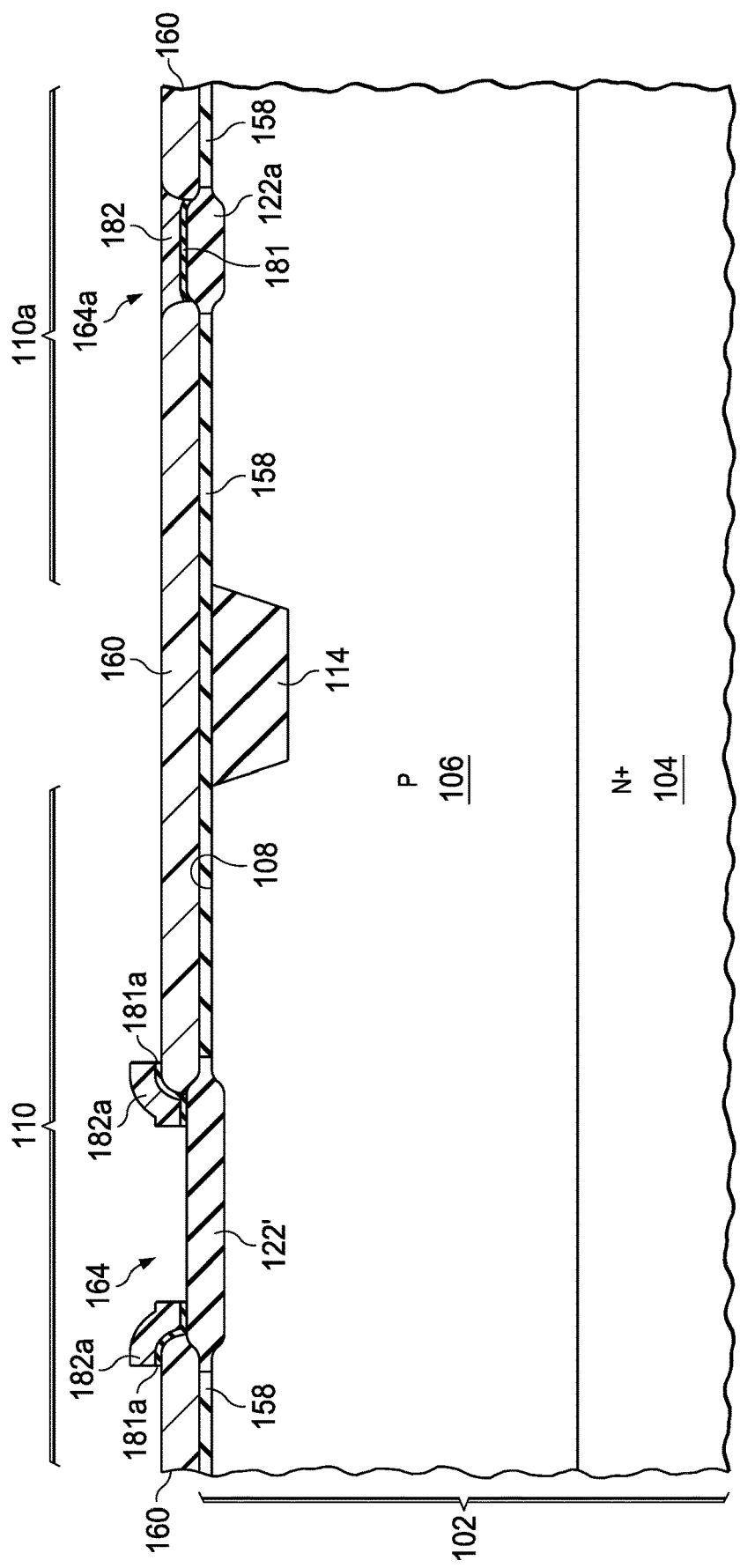

FIG. 2D shows results after patterning, generally using photoresist, and then etching the sacrificial sidewall film 182 to form sidewall spacers 182a in the $1^{st}$ first ODB layer opening 164, but not forming sidewall spacers shown as a continuous region of the sacrificial sidewall film 182 and second ODB layer 181 in the 2$^{nd}$ first ODB layer opening 164a, and then removing the 2$^{nd}$ ODB layer 181 in the 1st first ODB layer opening 164 to form spacers 181a under the sidewall spacers 182a where not protected by the sacrificial sidewall film 182.

Figure 2E:
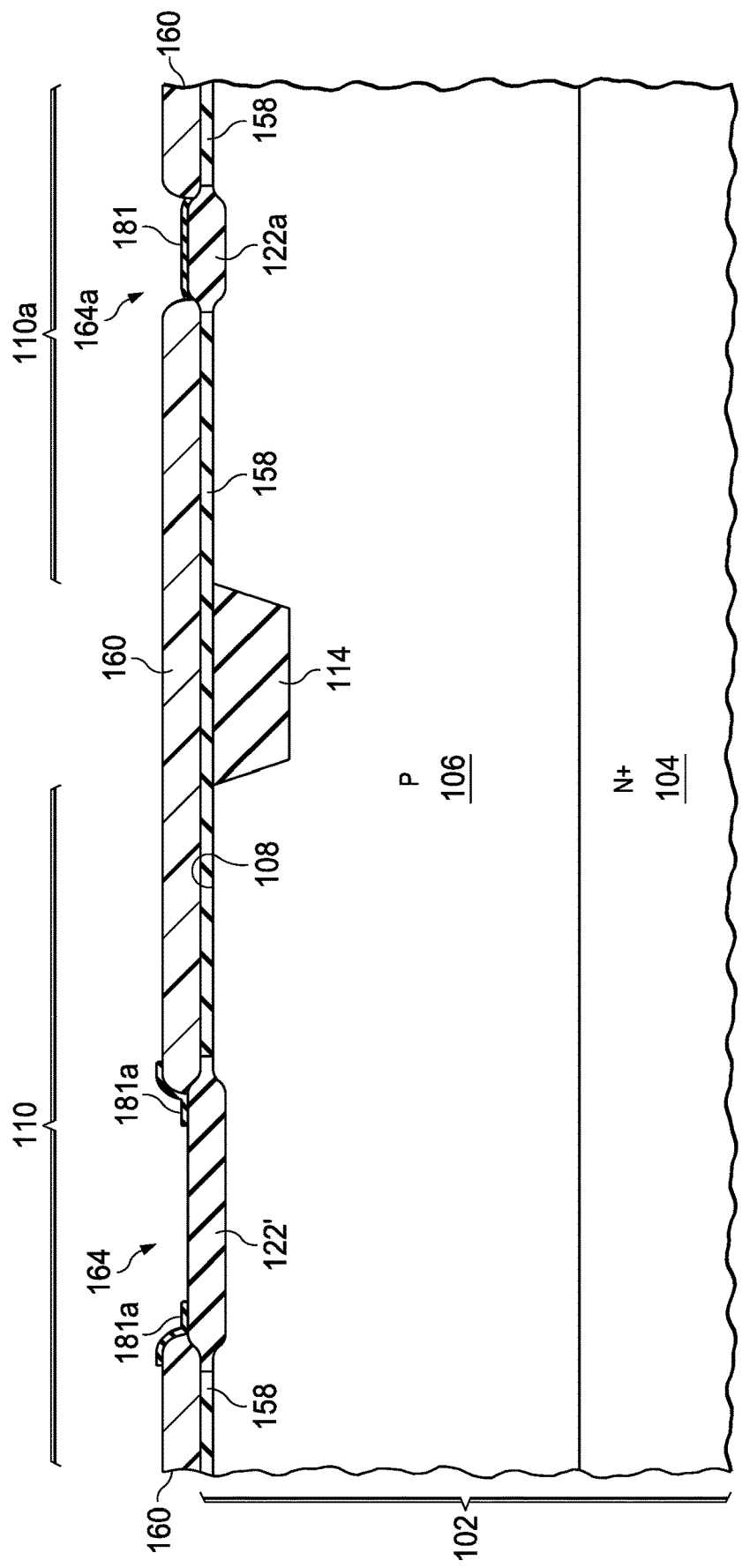
Figure 2F:
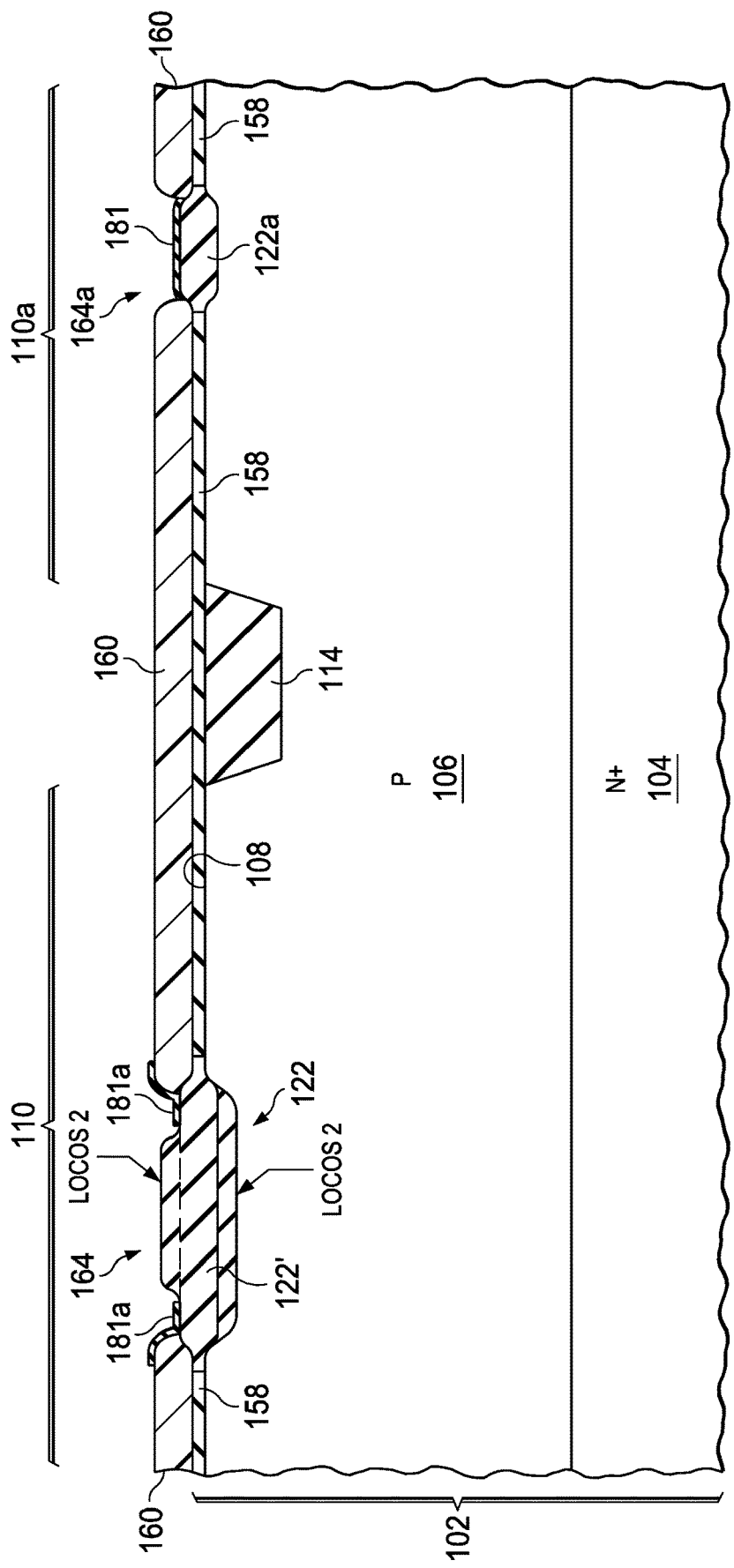

FIG. 2E shows results after stripping the sacrificial sidewall film 182 and sidewall spacers 182a shown in FIG. 2D, where the spacers 181a are still in the 1$^{st}$ first ODB layer opening 164. FIG. 2F shows results after growing a second LOCOS oxide layer resulting in an additional LOCOS portion shown as LOCOS 2 having a portion above and below the LOCOS field relief oxide 122' being previously formed LOCOS oxide to together provide the LOCOS field relief oxide 122, generally being 500 to 1,500 A of LOCOS 2 at the center of the 1st first ODB layer opening 164 for FET 110, with no LOCOS 2 shown grown in the 2$^{nd}$ first ODB layer opening 164a due to the presence of the second ODB layer 181 over the whole opening.

Thus for the 2$^{nd}$ first ODB layer opening 164a being narrower the sidewalls of the second ODB layer 181 remain merged so that only the first LOCOS oxidation process is able to oxidize the exposed silicon at the top surface 108 of the substrate 102. This thinner oxide is used to form the LOCOS field relief oxide for the lower voltage FET 110a. For the 1$^{st}$ first ODB layer opening 164 which is wider than the 2$^{nd}$ first ODB layer opening 164a, the sidewalls of the second ODB layer are distinct to provide spacers 181a, so that the second LOCOS oxidation can thicken the LOCOS layer in the 1$^{st}$ first ODB layer opening 164. The LOCOS oxide will be tapered under the spacers 181a, which is equivalent to a bird's beak region that is controlled by the spacer thickness. This thicker LOCOS oxide is used to form the LOCOS field relief oxide for the higher voltage field-plated FET 110.

Figure 2G:
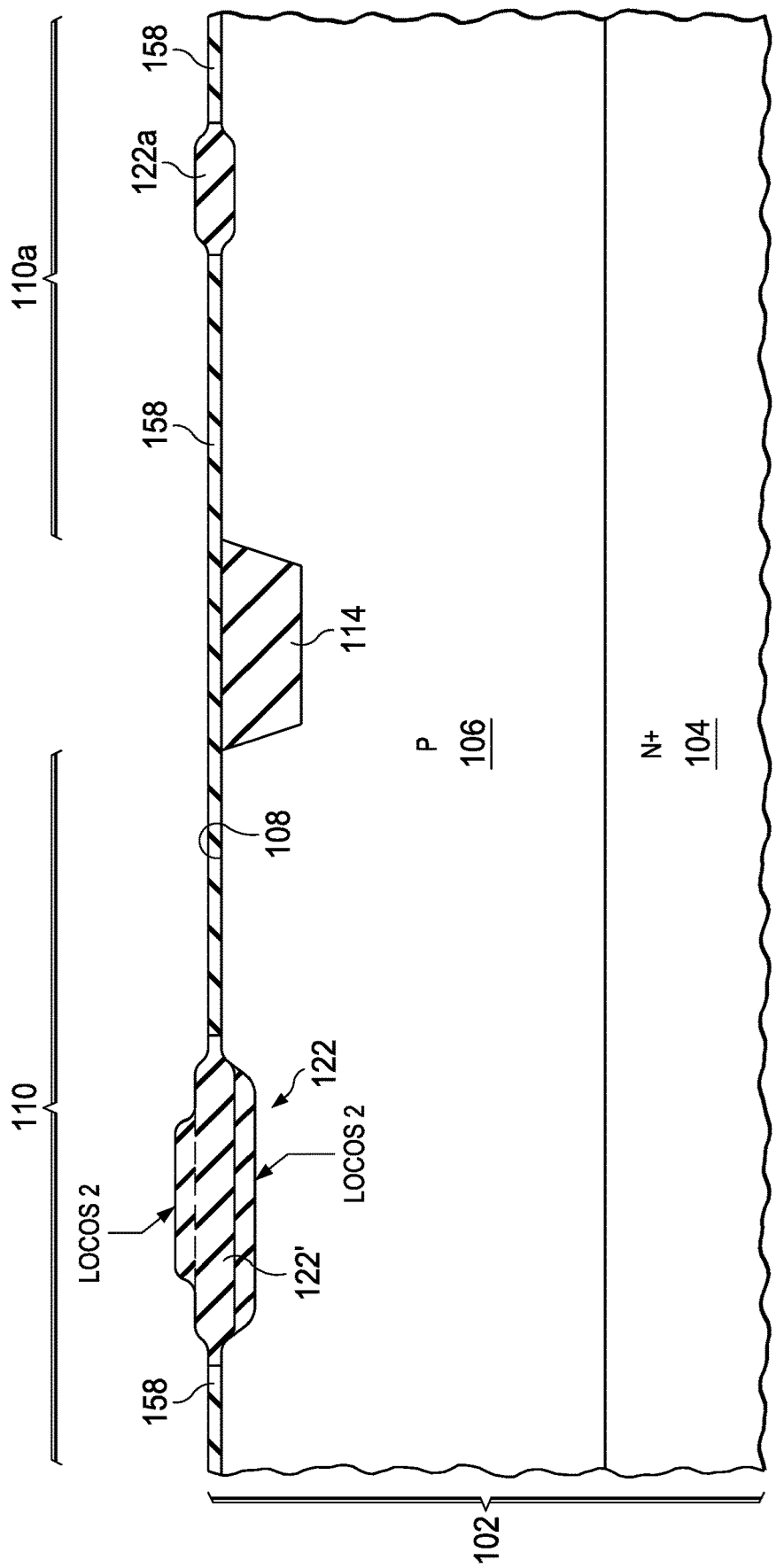

This completes the LOCOS field relief oxide 122, 122a thickness so that the LOCOS field relief oxide 122 is thicker for the field-plated FET 110 as compared to the LOCOS field relief oxide 122a thickness for the field-plated FET 110a. FIG. 2G shows results after removing the first ODB layer 160 and the second ODB layer 181 and spacers 181a.

Described below is front-end-of-the-line (FEOL) LDMOS processing to complete formation of the field-plated FETs 110, 110a, comprising forming a gate structure for the first field-plated field FET 110 with its gate partially over the LOCOS layer 122 and a gate structure for second field-plated field FET 110a with its gate partially over the LOCOS layer 122a, and then forming sources and drains. The p-type body 120 of the field-plated FETs 110, 110a are formed. The p-type body 120 may be formed by implanting p-type dopants implanted through the LOCOS field relief oxide 122, 122a such as boron at one or more energies, to provide a desired distribution of the p-type dopants. An example implant operation may include a first implant of boron at a dose of $1\times10^{14}$ cm$^{-2}$ to $3\times10^{14}$ cm$^{-2}$ at an energy of 80 keV to 150 keV, and a second implant of boron at a dose of $1\times10^{13}$ cm$^{-2}$ to $3\times10^{13}$ cm$^{-2}$ at an energy of 30 keV to 450 keV. A subsequent anneal process, such as a rapid thermal anneal at 1000° C. for 30 seconds, activates and diffuses the implanted boron.

A layer of gate dielectric material shown as 126 in FIG. 1A is formed on exposed semiconductor material at the top surface 108 of the substrate 102, including in the areas for the field-plated FETs 110, 110a. The layer of gate dielectric material 126 may include silicon dioxide, formed by thermal oxidation, and/or hafnium oxide or zirconium oxide, formed by CVD processes, and may include nitrogen atoms introduced by exposure to a nitrogen-containing plasma. A thickness of the layer of gate dielectric material 126 reflects operating voltages of the field-plated FETs 110, 110a. A layer of gate electrode material shown as 130 in FIG. 1A is formed over the layer of gate dielectric material 126 and the LOCOS field relief oxides 122, 122a. The layer of gate electrode material 130 may include, for example, polycrystalline silicon, referred to herein as polysilicon, possibly doped with n-type dopants. Other gate materials, such as titanium nitride or other metal comprising material for the layer of gate electrode material 130 are within the scope of the instant example. Polysilicon as the layer of gate electrode material 130 may be, for example, 300 nanometers to 800 nanometers thick.

A gate mask is then formed over the layer of gate electrode material 130 to cover areas for the gates for the field-plated FETs 110, 110a. The gate mask can extend partway over the LOCOS field relief oxides 122, 122a to cover an area for the field plate 132 of FIG. 1A. The gate mask may include photoresist formed by a photolithographic process. The gate mask may also include a layer of hard mask material such as silicon nitride and/or amorphous carbon. Further, the gate mask may include a layer of anti-reflection material, such as a layer of BARC.

A gate etch process is performed which removes the layer of gate electrode material where exposed by the gate mask, to form the gate electrodes 130 of the field-plated FETs 110, 110a. The gate etch process may be, for example, a reactive ion etch (RIE) process using fluorine radicals.

Gate sidewall spacers shown as 138 in FIG. 1A may be formed on side surfaces of the gates of the field-plated FETs 110, 110a by forming a conformal layer of sidewall material, possibly comprising more than one sub-layer of silicon nitride and/or silicon dioxide, over the gate electrode 130 and the top surface 108 of the substrate 102. Subsequently, an anisotropic etch such as a reactive ion etch (RIE) process removes the layer of sidewall material from top surfaces of the gate electrode 130 and the substrate 102, leaving the gate sidewall spacers 138 in place.

The n-type source 128 and n-type drain contact region 118 of the field-plated FETs 110, 110a may be formed by implanting n-type dopants such as phosphorus and arsenic, for example at a dose of $1\times10^{14}$ cm$^{-2}$ to $5\times10^{15}$ cm$^{-2}$ into the substrate 102 adjacent to the gate electrode 130 and the LOCOS field relief oxides 122, 122a, followed by an anneal operation, such as a spike anneal or a flash anneal, to activate the implanted dopants. An n-type drain extension portion of the source 128 which extends partway under the gate electrode 130 may be formed prior to forming the gate sidewall spacers 138 by implanting n-type dopants into the substrate adjacent to the gate electrodes 130, 130a.

The p-type body contact region 136 in the body 120 of the field-plated FETs 110, 110a may be formed by implanting p-type dopants such as boron, for example at a dose of $1\times10^{14}$ cm$^{-2}$ to $5\times10^{15}$ cm$^{-2}$ into the substrate 102, followed by an anneal operation, such as a spike anneal or a flash anneal, to activate the implanted dopants. The drift region 116 shown in FIG. 1A can then formed to be self-aligned with the LOCOS field relief oxides 122, 122a to provide a desired low value of the lateral distance that the gate overlaps the drift region 116, advantageously providing a low gate-drain capacitance. Alternatively, the drift region 116 may be formed at a significantly earlier stage of the process. Further, the self-aligned configuration may provide the lateral distance to be controllable from device to device without undesired variability due to unavoidable photolithographic alignment variations, sometimes referred to as alignment errors.

Applied to BiMOS processes, particularly for deep submicron processes, it is recognized that they need separate isolation oxides for CMOS device-to-device isolation (usually shallow-trench isolation or STI is used to isolate CMOS devices) and field plate formation for an LDMOS power transistor or other drain extended transistor. Some recent technology nodes have used a thin LOCOS layer to isolate the polysilicon field plate from the drift region. However the performance scaling in terms of specific on-resistance (RSP) general requires smaller half-pitches and more vertical current flow paths, similar to what the state-of-the-art discrete LDMOS transistors such as NEXFET power transistors from Texas Instruments use. To support these needs, a field relief oxide for LDMOS is needed that allows (i) a smaller and more controllable bird's beak region and (ii) a deeper, rounded bottom edge to support deeper current flow. Furthermore, integrated power technologies generally need a range of LDMOS voltage ratings to be supported. Therefore it is advantageous to have the disclosed ability to create more than one thickness of LOCOS field relief oxide as described in this Disclosure.

Disclosed aspects can be used to form semiconductor die that may be integrated into a variety of assembly flows to form a variety of different devices and related products. The semiconductor die may include various elements therein and/or layers thereon, including barrier layers, dielectric layers, device structures, active elements and passive elements including source regions, drain regions, bit lines, bases, emitters, collectors, conductive lines, conductive vias, etc. Moreover, the semiconductor die can be formed from a variety of processes including bipolar, Insulated Gate Bipolar Transistor (IGBT), CMOS, BiCMOS and MEMS.

Those skilled in the art to which this Disclosure relates will appreciate that many other aspects are possible within the scope of the claimed invention, and further additions, deletions, substitutions and modifications may be made to the described aspects without departing from the scope of this Disclosure.

The invention claimed is:

1. An integrated circuit (IC), comprising:
    a first field-plated field effect transistor (FET) having a first gate structure including a first gate electrode partially over a first field relief oxide and partially over a gate dielectric layer; and
    a second field-plated FET having a second gate structure including a second gate electrode partially over a second field relief oxide and partially over the gate dielectric layer, wherein:
        a first thickness of the first field relief oxide for the first field-plated FET is thicker than a second thickness of the second field relief oxide for the second field-plated FET;
        the first field relief oxide has first tapered edges, a center portion of the first thickness, and an intermediate portion between opposite edges of the first tapered edges and the center portion, the intermediate portion having a third thickness of the first field relief oxide that is less than the first thickness; and
        the second field relief oxide has second tapered edges and a top surface between the second tapered edges that is flat.

2. The IC of claim 1, wherein the second thickness of the second field relief oxide is 200 to 1,000 Å, and wherein the first thickness for the first field relief oxide is at least 500 Å thicker than the second thickness for the second field relief oxide.

3. The IC of claim 1, wherein a semiconductor surface layer is recessed under the first field relief oxide and the second field relief oxide.

4. The IC of claim 1, wherein the first thickness for the first field relief oxide is at least 500 Å thicker than the second thickness for the second field relief oxide.

5. The IC of claim 1, wherein the first field-plated FET and the second field plated FET each comprise a laterally diffused metal oxide semiconductor (LDMOS) device.

6. The IC of claim 1, wherein the gate electrode comprises polysilicon.

7. The IC of claim 1, wherein a thickness of the gate dielectric layer is less than half the second thickness of the second field relief oxide.

8. The IC of claim 1, wherein the first and second field-plated FETs each comprise a n-channel laterally diffused metal oxide semiconductor (LDMOS) device.

9. The IC of claim 1, wherein a source of the first field-plated FET and a source of the second field-plated FET are both connected to a ground node on the IC to be configured as power diodes.

10. The IC of claim 1, wherein both the first thickness and the third thickness are greater than the second thickness of the second field relief oxide.

11. An integrated circuit (IC), comprising:
    a first field-plated field effect transistor (FET) comprising a first gate structure including a first gate electrode partially over a first field relief oxide and partially over a first gate dielectric layer;
    a second field-plated FET comprising a second gate structure including a second gate electrode partially over a second field relief oxide and partially over a second gate dielectric layer; and
    sources and drains on respective sides of the first and second gate structures in a semiconductor surface layer; wherein:
        a first thickness of the first field relief oxide for the first field-plated FET is thicker than a second thickness of the second field relief oxide for the second field-plated FET,
        the first field relief oxide has first and second tapered edges, a center portion of the first thickness, and an intermediate portion between each of the first and second tapered edges and the center portion, the intermediate portion having a third thickness of the first field relief oxide that is less than the first thickness and greater than the second thickness; and
        the semiconductor surface layer is recessed under the first field relief oxide for the first field-plated FET and under the second field relief oxide for the second field-plated FET.

12. The IC of claim 11, wherein the second thickness of the second field relief oxide for the second field-plated FET is 200 to 1,000 Å, and wherein the first thickness for the first field relief oxide for the first field-plated FET is at least 500 Å thicker than the second thickness for the second field relief oxide for the second field-plated FET.

13. The IC of claim 11, wherein the first and second field-plated FETs comprise laterally diffused metal oxide semiconductor (LDMOS) devices.

14. The IC of claim 11, wherein a width of the first field relief oxide for the first field-plated FET is at least 0.05 μm greater than a width of the second field relief oxide for the second field-plated FET.

15. The IC of claim 11, wherein the first gate electrode comprises polysilicon.

16. The IC of claim 11, wherein the semiconductor surface layer comprises an epitaxial layer.

17. An integrated circuit (IC), comprising:
a first field-plated field effect transistor (FET) comprising a first gate structure including a first gate electrode partially over a first field relief oxide and partially over a first gate dielectric layer;
a second field-plated FET comprising a second gate structure including a second gate electrode partially over a second field relief oxide and partially over a second gate dielectric layer; and
sources and drains on respective sides of the first and second gate structures in a semiconductor surface layer; wherein:
a first thickness of the first field relief oxide for the first field-plated FET is thicker than a second thickness of the second field relief oxide for the second field-plated FET,
the first field relief oxide has first and second tapered edges, a center portion of the first thickness, and an intermediate portion between each of the first and second tapered edges and the center portion, the intermediate portion having a third thickness of the first field relief oxide that is less than the first thickness and greater than the second thickness, and
the thickness of the first and second field relief oxides are both at least twice as thick as the first and second gate dielectric layers.

18. The IC of claim 11, wherein the first and second field-plated FETs each comprise n-channel laterally diffused metal oxide semiconductor (LDMOS) devices.

19. An integrated circuit (IC), comprising:
a first field-plated field effect transistor (FET) having a first gate structure including a first gate electrode partially over a first field relief oxide and partially over a gate dielectric layer, wherein the first field relief oxide has first end portion, a second end portion, a center portion of a first thickness, and an intermediate portion of a second thickness less than the first thickness, the intermediate portion located between the center portion and both the first end portion and the second end portion; and
a second field-plated FET having a second gate structure including a second gate electrode partially over a second field relief oxide and partially over the gate dielectric layer, wherein the first and second thicknesses of the first field relief oxide for the first field-plated FET are thicker than a thickness of the second field relief oxide for the second field-plated FET.

* * * * *